(12) United States Patent
Itaya et al.

(10) Patent No.: US 9,601,010 B2
(45) Date of Patent: Mar. 21, 2017

(54) ASSESSMENT DEVICE, ASSESSMENT SYSTEM, ASSESSMENT METHOD, AND COMPUTER-READABLE STORAGE MEDIUM

(71) Applicant: NEC Corporation, Tokyo (JP)

(72) Inventors: Satoko Itaya, Tokyo (JP); Peter Davis, Kyoto (JP); Naoki Yoshinaga, Tokyo (JP); Rie Tanaka, Tokyo (JP); Taku Konishi, Tokyo (JP); Shinichi Doi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/440,791

(22) PCT Filed: Nov. 6, 2013

(86) PCT No.: PCT/JP2013/080038
§ 371 (c)(1),
(2) Date: May 5, 2015

(87) PCT Pub. No.: WO2014/073581
PCT Pub. Date: May 15, 2014

(65) Prior Publication Data
US 2015/0269839 A1 Sep. 24, 2015

(30) Foreign Application Priority Data
Nov. 6, 2012 (JP) .................................. 2012-244386

(51) Int. Cl.
*G08G 1/01* (2006.01)
*G06F 17/50* (2006.01)

(52) U.S. Cl.
CPC ........... *G08G 1/0125* (2013.01); *G06F 17/50* (2013.01); *G08G 1/0108* (2013.01)

(58) Field of Classification Search
CPC ........................... G08G 1/0125; G08G 1/0108
See application file for complete search history.

(56) References Cited

U.S. PATENT DOCUMENTS

| 6,331,851 B1 | 12/2001 | Suzuki et al. |
| 2003/0200075 A1 | 10/2003 | Meng et al. |
| (Continued) | | |

FOREIGN PATENT DOCUMENTS

| JP | 11-16001 | 1/1999 |
| JP | 2005-36289 | 2/2005 |
| (Continued) | | |

OTHER PUBLICATIONS

M. Yamaguchi, "Measurement and Control Technologies for Human Interface", 1st Edition, CMC Publishing Co., Ltd., Kenji TSUJI, pp. 123-138, Mar. 2009.

(Continued)

*Primary Examiner* — Leon Flores
(74) *Attorney, Agent, or Firm* — Finnegan, Henderson, Farabow, Garrett & Dunner, L.L.P.

(57) ABSTRACT

An assessment device (1) includes: a request acquirer (11) that accepts an evaluation target from a user terminal (7); a model acquirer (13) and a data acquirer (14) that select a main model for evaluating the evaluation target accepted by the request acquirer (11) from a plurality of models and select supplemental data to be supplemented for using the main model (data to be input into the main model, a sub-model, or data to be input into the sub-model) when the data to be input into the main model is insufficient; an executor (15) that evaluates the evaluation target based on the main model and supplemental data selected by the model acquirer (13) and the data acquirer (14); and a transmitter (16) that provides a result of the evaluation by the executor (15) to the outside.

18 Claims, 10 Drawing Sheets

(56) References Cited

U.S. PATENT DOCUMENTS

2007/0022327 A1    1/2007  Otsuka et al.
2011/0178938 A1    7/2011  Reich-Weiser et al.
2013/0238229 A1*   9/2013  Lundquist ............ G08G 1/0129
                                                      701/118

FOREIGN PATENT DOCUMENTS

| JP | 2005-523527 | 8/2005 |
| JP | 2007-26303  | 2/2007 |
| JP | 2011-59789  | 3/2011 |
| JP | 2011-175411 | 9/2011 |
| JP | 2012-18508  | 1/2012 |
| JP | 2012-513650 | 6/2012 |

OTHER PUBLICATIONS

H. Iwasaki, "Personalized Recommendation of content using Bayesian networks for a car navigation system", IEICE Technical Report, vol. 104, No. 226, pp. 25-30, Jul. 2004.
International Search Report mailed Jan. 28, 2014 in corresponding PCT International Application.

* cited by examiner

| MODEL ID | MODEL NAME | INPUT OUTPUT LIST | LOCATION |
|---|---|---|---|
| A0 | DATA ACQUISITION | INPUT 1: QUERY<br>OUTPUT 1: REQUESTED DATA | 0x12****** |
| A1 | TRAFFIC NOISE | INPUT 1: TRAFFIC STREAM MAP<br>INPUT 2: SOUND PROPAGATION CHARACTERISTIC<br>OUTPUT 1: TRAFFIC NOISE MAP | 0x12****** |
| A2 | TRAFFIC STREAM | INPUT 1: TRAFFIC NETWORK<br>INPUT 2: TRAFFIC TRIP STATISTICS<br>OUTPUT 1: TRAFFIC STREAM MAP | 0x12****** |
| A3 | TRAFFIC INFRASTRUCTURE | INPUT 1: TRAFFIC VOLUME<br>OUTPUT 1: TRAFFIC NETWORK | 0x12****** |
| A4 | TRAFFIC STATISTICS | INPUT 1: REGION NAME<br>OUTPUT 1: TRAFFIC TRIP STATISTICS | 0x12****** |
| A5 | SOUND PROPAGATION ENVIRONMENT | INPUT 1: REGION NAME<br>OUTPUT 1: SOUND PROPAGATION CHARACTERISTIC | 0x12****** |
| ⋮ | ⋮ | ⋮ | ⋮ |

FIG. 3

| DATA ID | DATA NAME | REGION NAME | RELATED MODEL ID | LOCATION |
|---|---|---|---|---|
| D1 | TRAFFIC VOLUME | X CITY | A3 | 0x05****** |
| D2 | TRAFFIC VOLUME | Y CITY | A3 | 0x05****** |
| D3 | TRAFFIC VOLUME | Z CITY | A3 | 0x05****** |
| ⋮ | ⋮ | ⋮ | ⋮ | ⋮ |
| D91 | POPULATION | X CITY | A21<br>A22 | 0x08****** |
| D92 | POPULATION | Y CITY | A21<br>A22 | 0x08****** |
| D93 | POPULATION | Z CITY | A21<br>A22 | 0x08****** |
| ⋮ | ⋮ | ⋮ | ⋮ | ⋮ |

FIG. 4

ASSESSMENT DEVICE, ASSESSMENT SYSTEM, ASSESSMENT METHOD, AND COMPUTER-READABLE STORAGE MEDIUM

CROSS-REFERENCE TO RELATED PATENT APPLICATIONS

This application is a National Stage Entry of International Application No. PCT/JP2013/080038, filed Nov. 6, 2013, which claims priority from Japanese Patent Application No. 2012-244386, filed Nov. 6, 2012. The entire contents of the above-referenced applications are expressly incorporated herein by reference.

TECHNICAL FIELD

The present disclosure relates to an assessment device, an assessment system, an assessment method, and a computer-readable non-transitory recording medium.

BACKGROUND ART

Patent Literatures 1 to 4 disclose technologies for evaluating a target, identified based on data input according to manipulation by a user, on the basis of a pre-stored model.

CITATION LIST

Patent Literature

Patent Literature 1: US Patent Application Publication No. 2011/178938
Patent Literature 2: Unexamined Japanese Patent Application Kokai Publication No. 2011-59789
Patent Literature 3: Unexamined Japanese Patent Application Kokai Publication No. 2012-18508
Patent Literature 4: National Patent Publication No. 2012-513650

SUMMARY OF INVENTION

Technical Problem

However, each device disclosed in Patent Literatures 1 to 4 always evaluates a target based on the same model. Therefore, such a kind of an device has a problem that it is impossible to appropriately evaluate various targets.

The present disclosure is directed at solving such a problem. An objective of the present disclosure is to provide an assessment device, an assessment system, an assessment method, and a computer-readable non-transitory recording medium, by which various targets can be appropriately evaluated.

Solution to Problem

An assessment device according to a first aspect of the present disclosure comprises:
    acceptor that accepts an evaluation target from outside;
    main model selector that selects a main model for evaluating the evaluation target accepted by the acceptor from a plurality of models;
    supplemental data selector that selects supplemental data to be supplemented for using the main model when data to be input into the main model selected by the main model selector is insufficient;
    evaluator that evaluates the evaluation target based on the main model selected by the main model selector and on the supplemental data selected by the supplemental data selector; and
    provider that provides a result, evaluated by the evaluator, to outside.

An assessment system according to a second aspect of the present disclosure comprises: an assessment device that accepts an evaluation target from outside; and a server connected to the assessment device via a network, wherein
    the server comprises:
    request information receiver that receives request information, representing the evaluation target, from the assessment device;
    main model selector that selects a main model for evaluating the evaluation target represented by the request information received by the request information receiver;
    supplemental data selector that selects supplemental data to be supplemented for using the main model when data to be input into the main model selected by the main model selector is insufficient; and
    transmitter that transmits the main model selected by the main model selector and the supplemental data selected by the supplemental data selector to the assessment device; and
        the assessment device comprises:
        acceptor that accepts the evaluation target from outside;
        transmitter that transmits request information, representing the evaluation target accepted by the acceptor, to the server;
        receiver that receives the main model and the supplemental data from the server;
        evaluator that evaluates the evaluation target based on the main model and the supplemental data received by the receiver; and
        provider that provides results, evaluated by the evaluator, to outside.

An assessment system according to a third aspect of the present disclosure comprises: an assessment device that accepts an evaluation target from outside; and a server connected to the assessment device via a network, wherein
    the server comprises:
    request information receiver that receives request information, representing the evaluation target, from the assessment device;
    main model selector that selects a main model for evaluating the evaluation target represented by the request information received by the request information receiver;
    supplemental data selector that selects supplemental data to be supplemented for using the main model when data to be input into the main model selected by the main model selector is insufficient;
    evaluator that evaluates the evaluation target based on the main model selected by the main model selector and on the supplemental data selected by the supplemental data selector; and
    transmitter that transmits results, evaluated by the evaluator, to the assessment device; and
        the assessment device comprises:
        acceptor that accepts the evaluation target from outside;
        transmitter that transmits request information, representing the evaluation target accepted by the acceptor, to the server;
        receiver that receives a result, in which the evaluation target is evaluated, from the server; and
        provider that provides the result, received by the receiver, to outside.

An assessment system according to a fourth aspect of the present disclosure comprises: a first assessment device that accepts an evaluation target from outside; and a second assessment device that communicates with the first assessment device, wherein the first assessment device comprises:

acceptor that accepts the evaluation target from outside;

main model selector that selects a main model for evaluating the evaluation target accepted by the acceptor;

supplemental data selector that selects supplemental data to be supplemented for using the main model when data to be input into the main model selected by the main model selector is insufficient;

requester that requests target data comprising at least part of the main model selected by the main model selector and the supplemental data selected by the supplemental data selector from the second assessment device;

receiver that receives the target data requested from the second assessment device;

evaluator that evaluates the evaluation target based on the target data received by the receiver and on data other than the target data; and provider that provides a result, evaluated by the evaluator, to outside; and the second assessment device comprises:

request acceptor that accepts a request of the target data from the first assessment device;

acquirer that acquires the target data accepted by the request acceptor; and transmitter that transmits the target data, acquired by the acquirer, to the first assessment device.

An assessment system according to a fifth aspect of the present disclosure comprises: a first assessment device that accepts an evaluation target from outside; and a second assessment device that communicates with the first assessment device, wherein the first assessment device comprises:

acceptor that accepts the evaluation target from outside;

main model selector that selects a main model for evaluating the evaluation target accepted by the acceptor;

supplemental data selector that selects supplemental data to be supplemented for using the main model when data to be input into the main model selected by the main model selector is insufficient;

requester that requests an evaluation according to target data, comprising at least part of the main model selected by the main model selector and the supplemental data selected by the supplemental data selector, from the second assessment device;

receiver that receives an evaluation result according to the target data from the second assessment device;

evaluator that evaluates the evaluation target based on the evaluation result according to the target data, received by the receiver, and on data other than the target data; and provider that provides a result, evaluated by the evaluator, to outside; and the second assessment device comprises:

request acceptor that accepts a request of the evaluation according to the target data from the first assessment device;

target data acquirer that acquires the target data according to the request accepted by the request acceptor;

target data evaluator that evaluates the target data acquired by the target data acquirer; and transmitter that transmits an evaluation result according to the target data, obtained from the target data evaluator, to the first assessment device.

An assessment method according to a sixth aspect of the present disclosure comprises:

an acceptance step of accepting an evaluation target from outside;

a main model selection step of selecting a main model for evaluating the evaluation target accepted in the acceptance step from a plurality of models;

a supplemental data selection step of selecting supplemental data to be supplemented for using the main model when data to be input into the main model selected in the main model selection step is insufficient;

an evaluation step of evaluating the evaluation target based on the main model selected in the main model selection step and on the supplemental data selected in the supplemental data selection step; and a provision step of providing a result, evaluated in the evaluation step, to outside.

In a computer-readable non-transitory recording medium according to a seventh aspect of the present disclosure, there is recorded a program that allows a computer to function as:

acceptor that accepts an evaluation target from outside;

main model selector that selects a main model for evaluating the evaluation target accepted by the acceptor from a plurality of models;

supplemental data selector that selects supplemental data to be supplemented for using the main model when data to be input into the main model selected by the main model selector is insufficient;

evaluator that evaluates the evaluation target based on the main model selected by the main model selector and on the supplemental data selected by the supplemental data selector; and provider that provides a result, evaluated by the evaluator, to outside.

Advantageous Effects of Invention

According to the present disclosure, various targets can be evaluated appropriately.

BRIEF DESCRIPTION OF DRAWINGS

FIG. 3 is a diagram illustrating the configuration of model-related information according to the first embodiment of the present disclosure;

FIG. 4 is a diagram illustrating the configuration of data-related information according to the first embodiment of the present disclosure;

DESCRIPTION OF EMBODIMENTS

Figure 1:
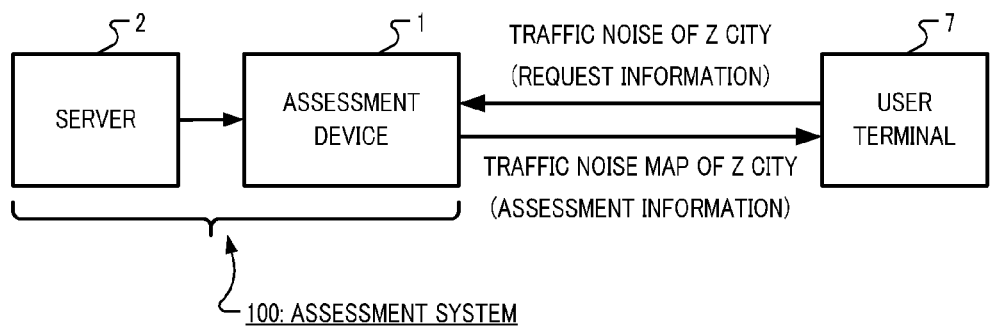
FIG. 1 is a pattern diagram illustrating a processing performed by an assessment device according to a first embodiment of the present disclosure.

An assessment device and an assessment system according to an embodiment of the present disclosure will be described in detail below with reference to the drawings. The same sign is applied to the same or equivalent portion in the drawings.

First Embodiment

The configuration of an assessment device 1 according to a first embodiment of the present disclosure is described with reference to FIG. 1 and FIG. 2. The assessment device 1 is a device that accepts an evaluation target from outside and evaluates the target. The following description is given taking, as an example, a case in which the assessment device 1 evaluates a target according to traffic.

The assessment device 1 is connected communicatively to a server 2 and a user terminal 7 via networks. The assessment device 1 and the server 2 form an assessment system 100.

The user terminal 7 comprises an input unit 71 and an output unit 72.

According to manipulation by a user, request information for requesting a target evaluation is input into the input unit 71, which transmits the request information to the assessment device 1. For example, according to manipulation by a user, request information comprising the character string "traffic noise of Z City" is input into the input unit 71, which transmits the request information to the assessment device 1.

The output unit 72 receives assessment information representing the result of evaluating the target from the assessment device 1. The output unit 72 outputs, as an image or voice, the assessment information received from the assessment device 1. For example, when the assessment information received from the assessment device 1 is image data representing "traffic noise map of Z City", the output unit 72 outputs the image data.

The server 2 comprises a model memory 21 and a data memory 22.

The model memory 21 stores a plurality of models for evaluating various targets. As used herein, "model" refers to a model in which an index for evaluating a target is formulated.

In addition, the model memory 21 stores information for identifying a model (hereinafter referred to as "model-related information"). The model-related information comprises: a model ID for uniquely identifying a model; a model name; an input/output list that represents the input/output of a model; and information that represents a location in which a model is stored in a memory (memory address), as represented in FIG. 3.

Each model represented by each model-related information is associated hierarchically. For example, the input data of a model of which the model ID is "A1" comprises the output data of a model of which the model ID is "A2" (traffic stream map) and the output data of a model of which the model ID is "A5" (sound propagation characteristic). When the input element of a certain model comprises the output element of another model in such a manner, each model may be considered to be associated hierarchically. The assessment device 1 refers to model-related information, selects a model for evaluating an evaluation target, and acquires the selected model from the model memory 21.

The data memory 22 stores data output from the assessment device 1. When the insufficient data of the model selected by the assessment device 1 is stored in the data memory 22, the assessment device 1 acquires the insufficient data from the data memory 22.

In addition, the data memory 22 stores information for identifying data (hereinafter referred to as "data-related information"). The data-related information comprises: a data ID for uniquely identifying data; a data name; a region name; a related-model ID for uniquely identifying a model into which the data is input; and information that represents a location in which data is stored in a memory (memory address), as represented in FIG. 4.

For example, data of which the data ID is "D3" represents "traffic volume of Z City". The data is used for input data for a model of which the model ID is "A3". The data memory 22 stores a plurality of items of data-related information. The assessment device 1 refers to data-related information, selects data for evaluating an evaluation target, and acquires the selected data from the data memory 22.

Figure 2:
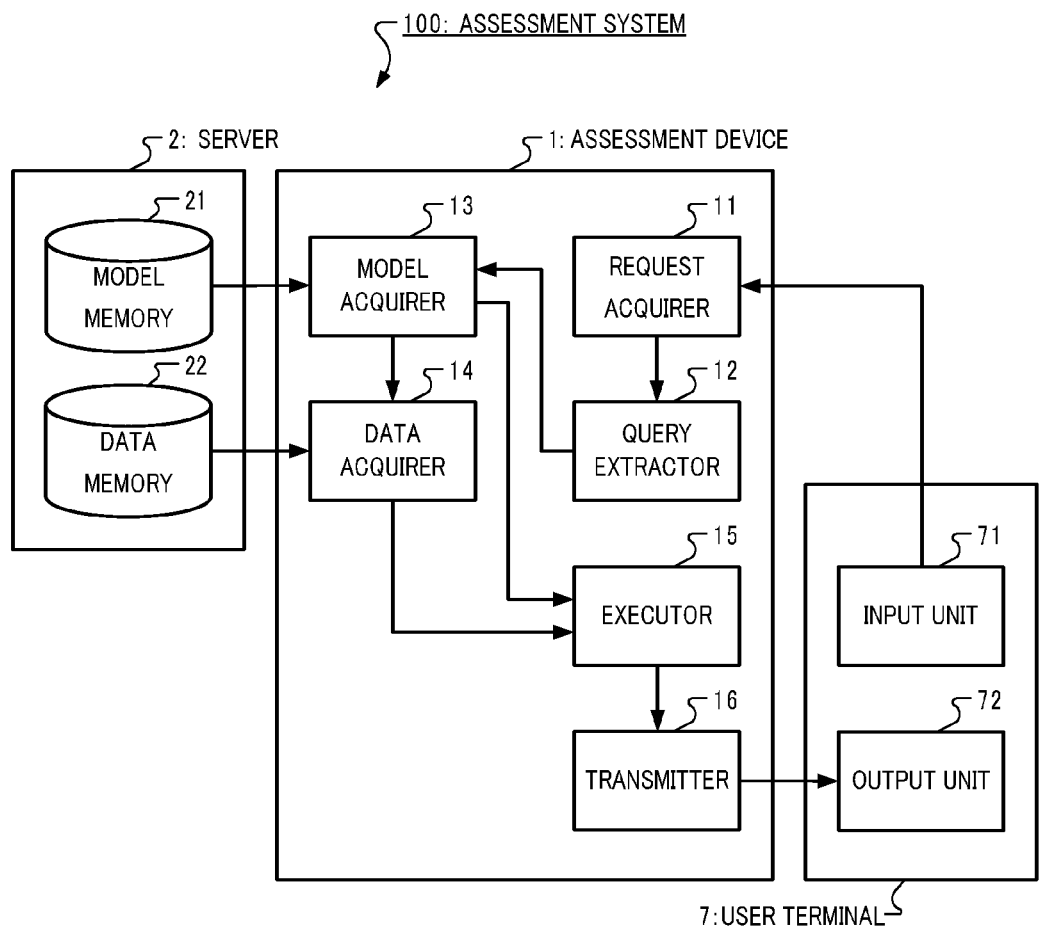
FIG. 2 is a block diagram illustrating the configuration of the assessment device according to the first embodiment of the present disclosure.

The assessment device 1 comprises a request acquirer 11, a query extractor 12, a model acquirer 13, a data acquirer 14, an executor 15, and a transmitter 16 as represented in FIG. 2. The request acquirer 11, the query extractor 12, the model acquirer 13, the data acquirer 14, the executor 15, and the transmitter 16 function when the assessment device 1 starts, and repeatedly performs assessment processing comprising the following (A) to (C) until the assessment device 1 stops.

(A) Operation of extracting a query representing an evaluation target based on request information received from the user terminal 7

(B) Operation of selecting a model and data necessary for evaluating the extracted query (evaluation target)

(C) Operation of evaluating the evaluation target based on the selected model and data and transmitting assessment information that represents the result of the evaluation to the user terminal 7

Figure 5:
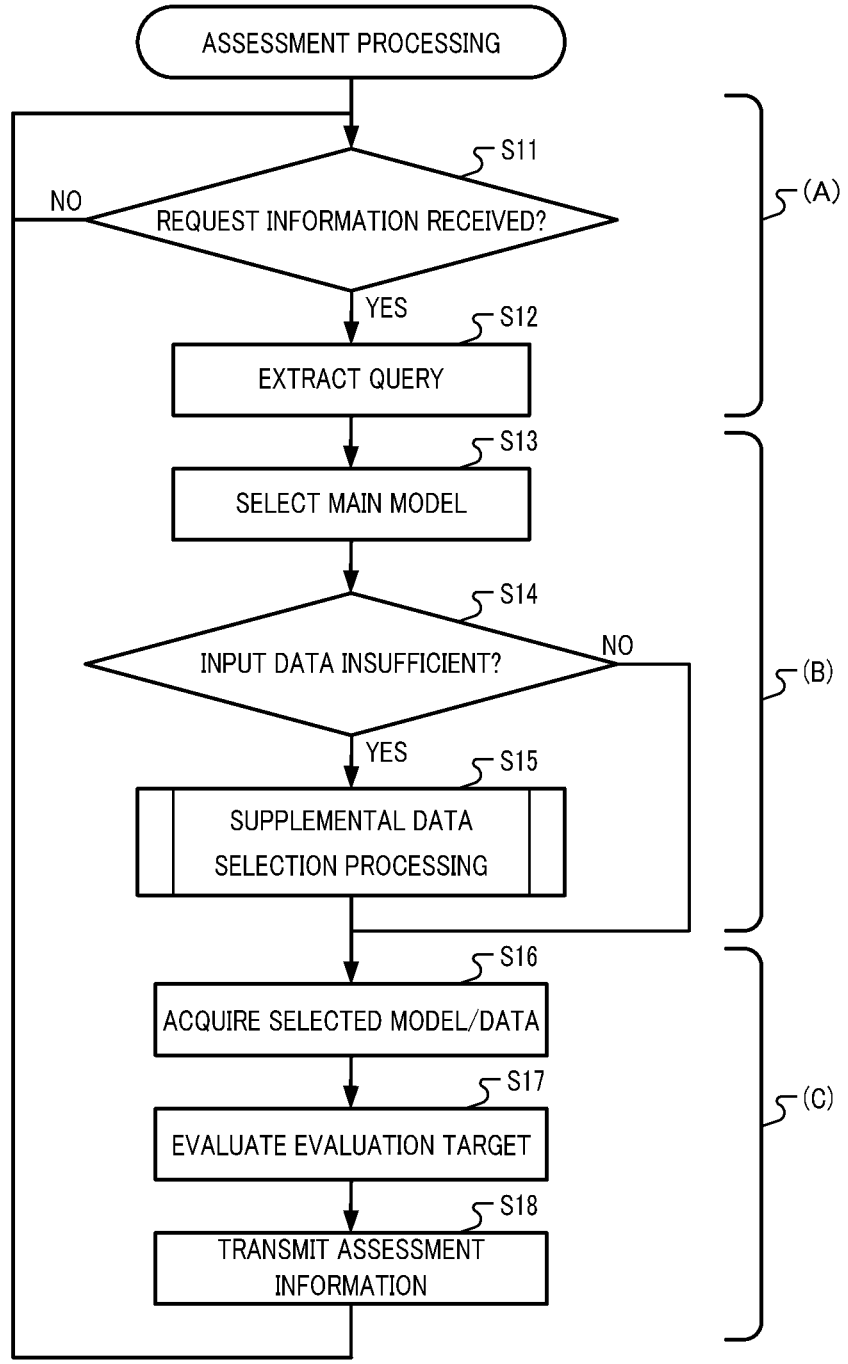
FIG. 5 is a flowchart illustrating a processing performed by the assessment device according to the first embodiment of the present disclosure.

Assessment processing performed by the assessment device 1 (the request acquirer 11, the query extractor 12, the model acquirer 13, the data acquirer 14, the executor 15, and the transmitter 16) will be explained below with reference to FIG. 5.

After the start of the assessment device 1, the request acquirer 11 determines whether or not to receive request information from the user terminal 7 (step S11). The request acquirer 11 is in a standby state (step S11; NO) until receiving request information from the user terminal 7. When the request acquirer 11 determines that request information has been received (step S11; YES), the request acquirer 11 supplies the request information to the query extractor 12. For example, the request acquirer 11 receives request information comprising the character string "traffic noise of Z City" from the user terminal 7 and supplies the request information to the query extractor 12.

The query extractor 12 receives the request information from the request acquirer 11. The query extractor 12 extracts a query from the received request information (step S12).

Specifically, the query extractor 12 performs morphological analysis of the request information to thereby divide a character string represented by the request information into words. The query extractor 12 filters each divided word to thereby exclude unnecessary words (postpositional particle and the like). Then, the query extractor 12 extracts a query from the remaining words (words that have not been excluded). For example, the query extractor 12 refers to a memory in which region names, indices, and the like are individually stored, to thereby extract a query from the remaining words. The query extractor 12 identifies the extracted query as an evaluation target and supplies the extracted query to the model acquirer 13.

Specifically, the query extractor 12 extracts a query (evaluation target) representing the region name "Z City" and the index "traffic noise" from the character string "traffic noise of Z City" received from the request acquirer 11. In addition to the method mentioned above, the query extractor 12 may provide screen information, allowing a user to select a query, to the user terminal 7. In this case, the query extractor 12 acquires the query, selected according to manipulation by the user, from the user terminal 7 via the request acquirer 11.

The model acquirer 13 receives the query from the query extractor 12. The model acquirer 13 refers to the model-related information stored in the model memory 21 and selects a model for evaluating an evaluation target represented by the received query (hereinafter referred to as "main model") (step S13). For example, the query mentioned above represents the index "traffic noise". In this case, the model acquirer 13 selects a main model by selecting model-related information of which the model name is "traffic noise" (model-related information of which the model ID is "A1") from the model-related information represented in FIG. 3. The model acquirer 13 may select not only a model, of which the model name completely matches with an index, as a main model but also a model partially matching with the index or a model similar to the index as the main model. The model acquirer 13 selects the model similar to the index based on, for example, a dictionary (thesaurus) in which words are classified and organized according to an upper-lower relationship, a part-whole relationship, a synonymous relationship, a synonym relationship, and/or the like.

Subsequently, the model acquirer 13 determines whether or not the input data of the main model is insufficient (step S14). Whether or not the input data of the main model is insufficient is determined according to whether or not data included in the query can form the input data of the main model (holds the input data of the main model). For example, the query mentioned above represents the region name "Z City" and the index "traffic noise". The above-mentioned main model of which the model ID is "A1" requires first input data representing the region name "Z City" and the data name "traffic stream map" and second input data representing the region name "Z City" and the data name "sound propagation characteristic". In this case, the model acquirer 13 determines that the input data of the selected main model is insufficient since none of the items of the input data of the main model can be formed of the data included in the query.

When the model acquirer 13 determines that the input data of the main model is insufficient (step S14; YES), the data acquirer 14 performs supplemental data selection processing for selecting supplemental data to be supplemented for using the main model (step S15).

Figure 6:
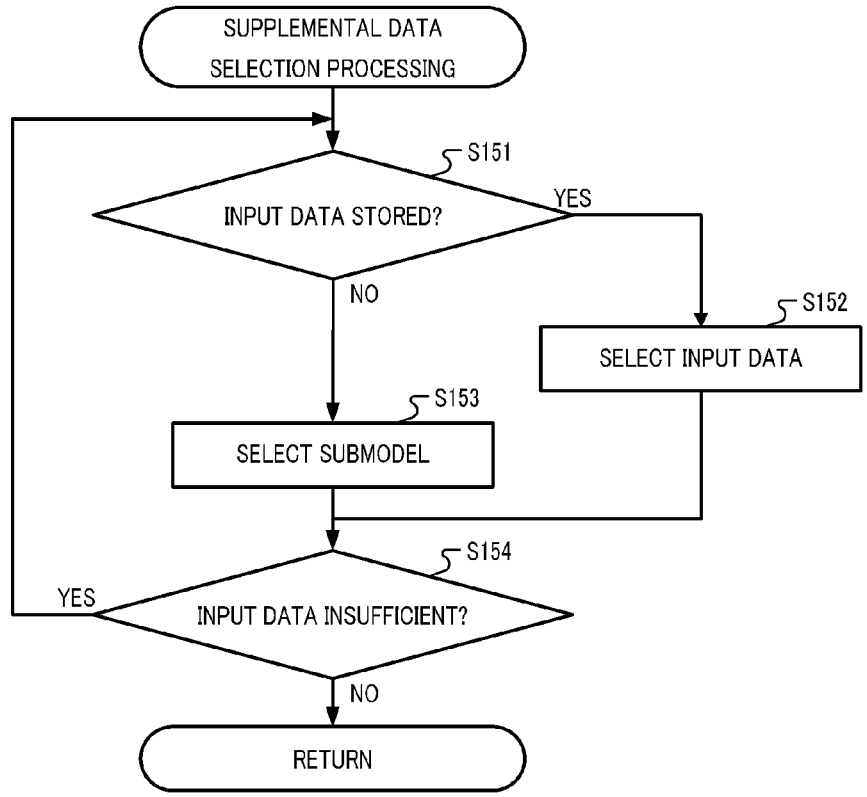
FIG. 6 is a flowchart illustrating supplemental data selection processing illustrated in FIG. 2.

The supplemental data selection processing represented in step S15 in FIG. 5 will be described with reference to FIG. 6.

The data acquirer 14 determines whether or not the insufficient input data of the main model is stored in the data memory 22 (step S151). For example, in the case of the input data (first and second input data) of the above-mentioned main model (model of which the model ID is "A1"), the data-related information represented in FIG. 4 does not include data-related information representing the input data. Thus, in this case, the data acquirer 14 determines that the insufficient input data of the main model is not stored in the data memory 22.

In contrast, when the data acquirer 14 determines that the insufficient input data of the main model is stored in the data memory 22 (step S151; YES), the data acquirer 14 selects the input data as supplemental data (step S152).

After the selection of the input data by the data acquirer 14, the model acquirer 13 determines whether or not additional input data is insufficient (step S154). The model acquirer 13 returns to step S151 when determining that the input data of the main model is insufficient (step S154; YES). In contrast, the model acquirer 13 goes to step S16 represented in FIG. 5 when determining that any additional insufficient input data is not present (step S154; NO).

When in step S151, the data acquirer 14 determines that the insufficient input data of the main model is not stored (step S151; NO), the model acquirer 13 selects, as supplemental data, a model that outputs the insufficient input data (hereinafter referred to as "sub-model") (step S153). For example, in the example mentioned above, the model acquirer 13 refers to model-related information stored in the model memory 21 and selects, as supplemental data, sub-models (models of which the model IDs are "A2" and "A5") that output the first and second input data of the selected main model (model of which the model ID is "A1").

After the selection of the sub-model, the model acquirer 13 determines whether or not additional input data is insufficient (step S154). The model acquirer 13 returns to step S151 when determining that the input data of the selected sub-model is insufficient (step S154; YES). In contrast, the model acquirer 13 goes to step S16 represented in FIG. 5 when determining that any additional insufficient input data is not present (step S154; NO). For example, first input data representing the region name "Z City" and the data name "traffic network" and second input data representing the region name "Z City" and the data name "traffic trip statistics" are necessary for using the sub-model of which the model ID is "A2" when the above-mentioned query is received. However, each input data is not included in the above-mentioned query. Thus, the model acquirer 13 determines that the input data of the sub-model of which the model ID is "A2" is insufficient. In contrast, only the input data representing the region name is necessary for using the sub-model of which the model ID is "A5" when the above-mentioned query is received, and the input data is included in the above-mentioned query. Thus, the model acquirer 13 determines that the input data of the sub-model of which the model ID is "A5" is not insufficient.

The data acquirer 14 returns to step S151 when the input data of the sub-model is insufficient. In addition, the data acquirer 14 determines whether or not the insufficient input data of the sub-model is stored in the data memory 22 (step S151) in a manner similar to that in a case in which the input data of the main model is insufficient.

For example, the data-related information represented in FIG. 4 does not include data-related information representing the input data of the above-mentioned sub-model of which the model ID is "A2" (first input data representing the region name "Z City" and the data name "traffic network"

and second input data representing the region name "Z City" and the data name "traffic trip statistics"). Thus, in this case, the data acquirer 14 determines that the insufficient input data of the sub-model is not stored in the data memory 22 (step S151; NO). In addition, in this case, the model acquirer 13 selects, as supplemental data, the sub-model that outputs the insufficient input data (step S153). For example, the model acquirer 13 refers to model-related information stored in the model memory 21 and selects, as supplemental data, sub-models (models of which the model IDs are "A3" and "A4") that output the first and second input data of the sub-model of which the model ID is "A2".

Then, the model acquirer 13 performs the processing of step S154 described above for the selected sub-models. For example, input data representing the region name "Z City" and the data name "traffic volume" is necessary for using the sub-model of which the model ID is "A3" when the query mentioned above is received. However, the above-mentioned query does not include the input data. Thus, in the example mentioned above, the model acquirer 13 determines that the input data of the sub-model of which the model ID is "A3" is insufficient. In contrast, only the input data representing the region name is necessary for using the sub-model of which the model ID is "A4" when the above-mentioned query is received, and the input data is included in the above-mentioned query. Thus, in the example mentioned above, the model acquirer 13 determines that the input data of the sub-model of which the model ID is "A4" is not insufficient.

When the input data of the sub-model is insufficient, the data acquirer 14 returns to step S151 in a manner similar to that described above. In other words, the data acquirer 14 determines whether or not the insufficient input data of the sub-model of which the model ID is "A3" is stored in the data memory 22 (step S151).

The data-related information represented in FIG. 4 includes data-related information representing the input data of the sub-model of which the model ID is "A3" (input data representing the region name "Z City" and the data name "traffic volume") (data of which the data ID is "D3"). Thus, in this case, the data acquirer 14 determines that the insufficient input data of the sub-model is stored in the data memory 22 (step S151; YES). In this case, the data acquirer 14 selects the input data as supplemental data (step S152). After the selection of the input data by the data acquirer 14, the model acquirer 13 determines whether or not additional input data is insufficient (step S154).

In such a manner, the model acquirer 13 and the data acquirer 14 repeatedly perform supplemental data selection processing comprising steps S151 to S154 until the model acquirer 13 determines that any insufficient input data is not present in a main model or sub-models (step S154; NO). In other words, a case in which the model acquirer 13 determines that any insufficient input data of the main model or the sub-models is not present means that all the models and data necessary for evaluating the extracted query (evaluation target) are selected.

Referring back to FIG. 5, the model acquirer 13 and the data acquirer 14 acquire the main model selected in step S13 and the supplemental data selected in step S15 (step S16). For example, when the above-mentioned query is received, the model creator 13 acquires the main model of which the model ID is "A1" and the sub-models of which the model IDs are "A2" to "A5". The model acquirer 13 combines the main model and the sub-model in reverse order that the main model and the sub-model have been selected. The model acquirer 13 supplies the combined main model and sub-models to the executor 15. In addition, the data acquirer 14 acquires the data of which the data ID is "D3". The data acquirer 14 supplies the acquired data to the executor 15.

When the query extracted in step S12 includes input data to be input into the main model (when holding data to be input into the main model), the model acquirer 13 determines that the input data of the main model is not insufficient (step S14; NO). In this case, the model acquirer 13 supplies only the selected main model to the executor 15 in step 16.

The executor 15 receives the model (combination of the main model and the sub-models, or only the main model) acquired by the model acquirer 13. In addition, the executor 15 receives the data acquired by the data acquirer 14. The executor 15 evaluates an evaluation target (query) by inputting data to be input into each model (main model or sub-model) received from the model acquirer 13 (step S17).

Figure 7:
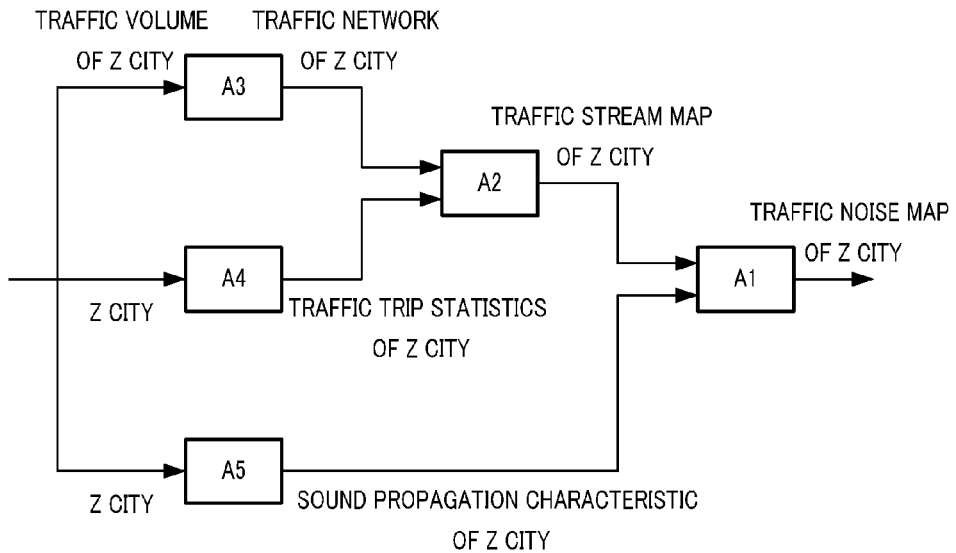
FIG. 7 is a pattern diagram illustrating a state in which a main model and supplemental data are arranged.

For example, the executor 15 inputs "traffic volume of Z City", received from the data acquirer 14, into the sub-model of which the model ID is "A3" as represented in FIG. 7. In addition, the executor 15 inputs "Z City", which is a region name included in the query, into the sub-models of which the model IDs are "A4" and "A5". As a result, "traffic network of Z City" is output based on the sub-model of which the model ID is "A3". In addition, "traffic trip statistics of Z City" is output based on the sub-model of which the model ID is "A4". In addition, "sound propagation characteristic of Z City" is output based on the sub-model of which the model ID is "A5".

The executor 15 inputs the data ("traffic network of Z City") output based on the sub-model of which the model ID is "A3" and the data ("traffic trip statistics of Z City") output based on the sub-model of which the model ID is "A4" into the sub-model of which the model ID is "A2". As a result, "traffic stream map of Z City" is output based on the sub-model of which the model ID is "A2".

The executor 15 inputs the data ("traffic stream map of Z City") acquired by the sub-model of which the model ID is "A2" and the data ("sound propagation characteristic of Z City") acquired by the sub-model of which the model ID is "A5" into the main model of which the model ID is "A1". As a result, "traffic noise map of Z City" is acquired by the main model.

The executor 15 supplies assessment information representing the result of the evaluation of the evaluation target to the transmitter 16. The transmitter 16 transmits the assessment information, received from the executor 15, to the user terminal 7 (step S18). Then, the request acquirer 11 returns to step S11 and is in a standby state until receiving the next request information.

The assessment processing comprising steps S11 to S18 in such a manner is performed until the assessment device 1 stops.

As described above, in accordance with the assessment device 1 according to the first embodiment, a main model for evaluating the target and supplemental data to be supplemented for using the main model (data to be input into the main model, a sub-model, and data to be input into the sub-model) are acquired based on an evaluation target accepted from the user terminal 7. The assessment device 1 evaluates the evaluation target based on the acquired main model and supplemental data and provides the result to the user terminal 7. As a result, the assessment device 1 can appropriately evaluate various targets and can appropriately honor a request for the evaluation of the targets.

The executor 15 of the assessment device 1 described above may allow the assessment information transmitted to the user terminal 7 in step S18, together with the query extracted in step S12, to be stored in the data memory 22. In this case, the assessment device 1 may divert the assessment information into subsequent assessment processing. For example, the query extractor 12 extracts a query in step S12, and the data acquirer 14 thereafter determines whether or not assessment information corresponding to the query is stored in the data memory 22. When the data acquirer 14 determines that the assessment information corresponding to the query is present in the data memory 22, the data acquirer 14 may transmit the assessment information to the user terminal 7 via the transmitter 16. As a result, time until the assessment device 1 evaluates the query and the load of processing can be reduced. When the data acquirer 14 determines that any assessment information corresponding to the query is not present, processing in step S13 and subsequent steps is performed in a manner similar to that in the embodiment described above.

When a query includes a plurality of indices, the model acquirer 13 of the assessment device 1 may also select a plurality of main models corresponding to the respective indices. In this case, the model acquirer 13 and the data acquirer 14 select supplemental data to be supplemented for using each main model. The model acquirer 13 may also select a plurality of main models based on model-related information stored in the model memory 21 even if an index included in a query is only one.

The assessment system 100 may comprise a plurality of user terminals 7 and a plurality of servers 2. The assessment device 1 may comprise at least part of the configurations of the user terminal 7 and the server 2, or the user terminal 7 and the server 2 may be used as the accessories of the assessment device 1.

The model-related information stored in the model memory 21 may include, in addition to the model-related information represented in FIG. 3, meta-information for limiting a model to be selected, such as model reliability, a usage fee, processing time, a supplier company name, creation time, precision, a language, the frequency of use, a past user, or a usage result (such as the name of a model created using the model).

For example, the user terminal 7 inputs, in addition to "traffic noise of Z City", "processing time of not more than Y" according to manipulation by a user. In this case, the query extractor 12 of the assessment device 1 extracts a query representing processing time of "not more than Y" as well as the region name "Z City" and the index "traffic noise" from request information received from the user terminal 7. In this case, the model acquirer 13 selects a main model based on processing time of "not more than Y" so that the total of processing time is not more than Y. In such a manner, a condition for limiting a model to be selected may be set depending on meta-information.

The data-related information stored in the data memory 22 may include meta-information for limiting data to be selected, such as data reliability, a usage fee, a supplier company name, creation time, precision, a language, the frequency of use, a past user, or a usage result (such as the name of a model created using the data).

For example, the user terminal inputs, in addition to "traffic noise of Z City", "data reliability of not less than X" according to manipulation by a user. In this case, the query extractor 12 of the assessment device 1 extracts a query representing a data reliability "of not less than X" as well as the region name "Z City" and the index "traffic noise" from request information received from the user terminal 7. In this case, the data acquirer 14 selects only the data having a reliability of not less than X. In such a manner, a condition for limiting data to be selected may be set depending on meta-information.

Each of the model-related information stored in the model memory 21 and the data-related information stored in the data memory 22 may also have access limitation information representing the acceptance or rejection of access to a model or data on each user identification information. The user terminal 7 inputs user identification information according to manipulation by a user and transmits the user identification information, together with request information, to the assessment device 1. For a model or data to be selected, the model acquirer 13 or the data acquirer 14 determines the acceptance or rejection of access to the model or data with reference to the access limitation information corresponding to the received user identification information. The model acquirer 13 or the data acquirer 14 may acquire a model or data to be acquired based on the determination result.

Although the example mentioned above is described by taking, as an example, a case in which evaluation for each region is performed based on various indices according to traffic, a region/place name, a group/organization, the assembly of groups/organizations, the species/class of an organism, a target for observation of geography/sea/weather, a system (a transportation system, an energy control system, a lighting system, a system for producing a drug/biochemical, or the like, or an overall mechanical/electronic information system), or the like can be appropriately set as an evaluation target.

As the index, there may be adopted an index for evaluating a traffic jam state, a traffic noise volume, the incidence (spread rate) of a plague, a traffic accident rate, sales, a generation rate, a population size, the number of users, an economic effect, a happiness level, a satisfaction level, a human development index, an ICT development index, or the like. The evaluation target may be a region, period, an industry type, an age group/generation, sex, a material, a company, an aggregate thereof, or the like. The unit of evaluation may be day/month/phase/year, city, town, and village/prefecture/country, organization and group/assembly of organization and group, field/time/person, or the like.

Although the example mentioned above is described by taking, as examples, various models according to traffic, there may be adopted a model in which an index according to physical distribution or energy (energy demand or energy supply) is formulated. There may be adopted a model in which a higher-level index such as a satisfaction level or a happiness level is calculated from a lower-level index such as an income.

Second Embodiment

Figure 8:
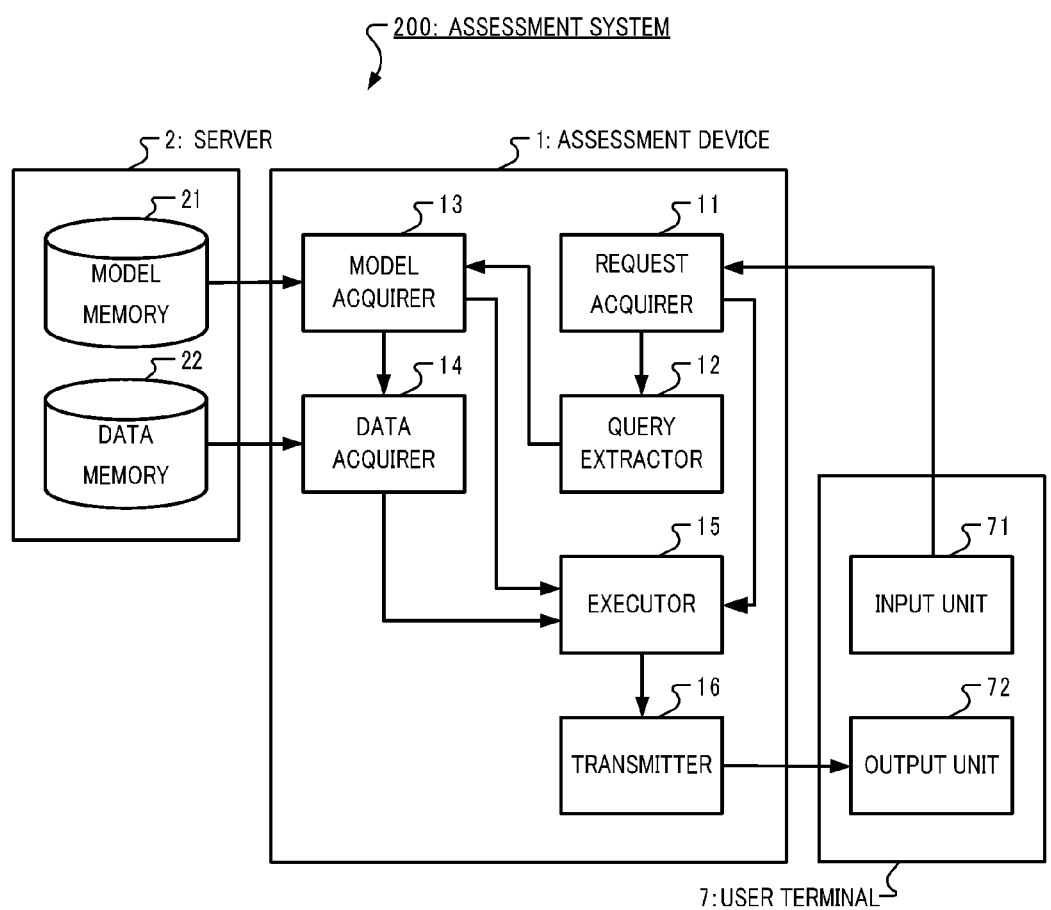
FIG. 8 is a block diagram illustrating the configuration of an assessment system according to a second embodiment of the present disclosure.

The configuration of an assessment device 1 according to a second embodiment of the present disclosure will be described below with reference to FIG. 8. The assessment device 1 comprises a configuration similar to the configuration described in the first embodiment. The assessment device 1 provides the list of main models and supplemental data to a user as well as carries out the operations described in the first embodiment described above. In addition, the assessment device 1 evaluates an evaluation target based on the main models and supplemental data selected according to manipulation by the user. In addition, the assessment device 1 and a server 2 form an assessment system 200.

Assessment processing executed by the assessment device 1 will be described below with reference to FIG. 9.

Figure 9:
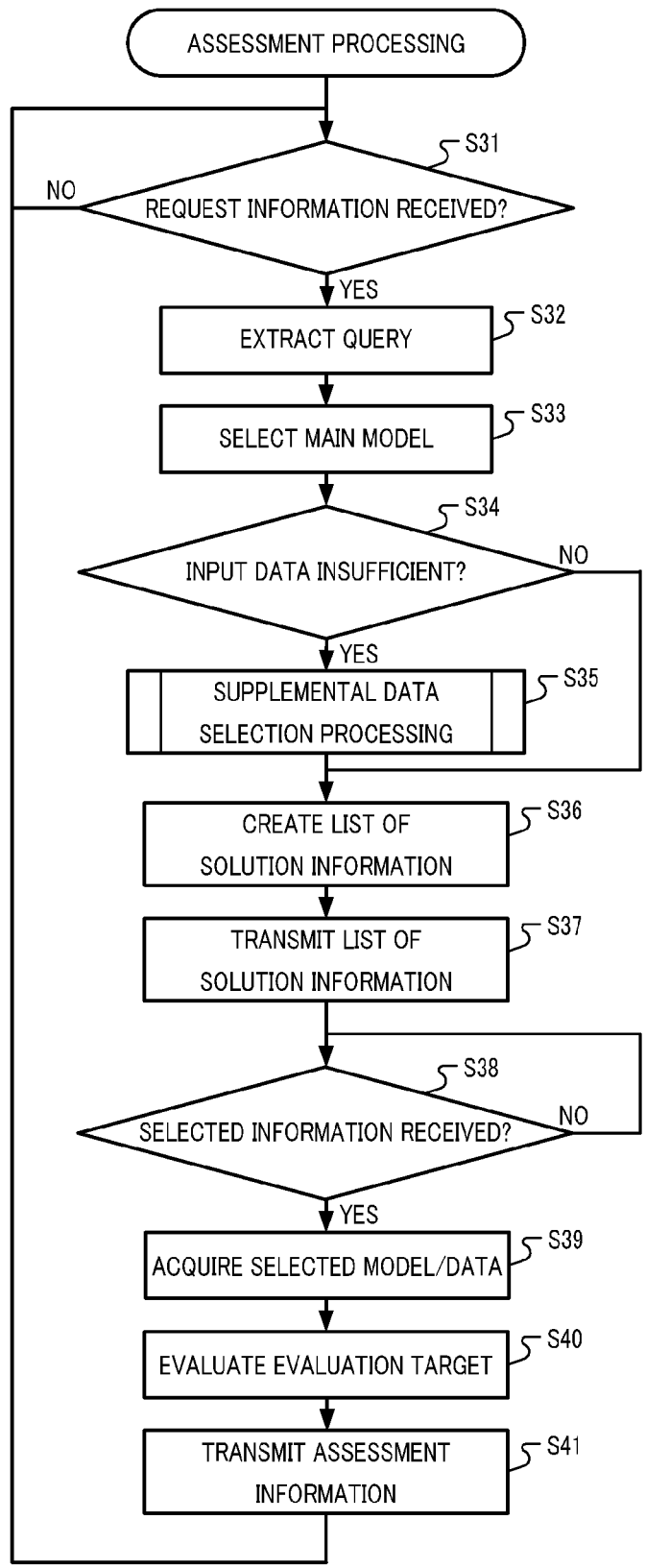
FIG. 9 is a flowchart illustrating processing performed by the assessment device according to the second embodiment of the present disclosure.

The processing of step S31 to step S35 represented in FIG. 9 is similar to the processing of step S11 to step S15 represented in FIG. 2.

An executor 15 in the assessment device 1 creates the list of solution information representing main models selected by a model acquirer 13 in step S33 and supplemental data selected by the model acquirer 13 and a data acquirer 14 in step S35 (step S36). For example, when a plurality of main models are selected by the model acquirer 13, the executor 15 creates information for identifying the output data of each main model as the list of solution information. The executor 15 supplies the created list of the solution information to a transmitter 16.

The transmitter 16 transmits the list of the solution information, received from the executor 15, to a user terminal 7 (step S38).

An output unit 72 in the user terminal 7 receives the list of the solution information from the assessment device 1. The output unit 72 outputs the list of the solution information as an image or voice. User selects solution information from the list. An input unit 71 transmits the selected information which is the solution information according to manipulation of the user to the assessment device 1.

A request acquirer 11 in the assessment device 1 is in a standby state until receiving the selected information from the user terminal 7 (step S39; NO). The request acquirer 11 supplies the selected information to the executor 15 when determining that the selected information is received (step S39; YES).

The executor 15 acquires the main models selected by the model acquirer 13 in step S33 and the supplemental data (including sub-models) selected by the model acquirer 13 and the data acquirer 14 in step S35 based on the selected information received from the request acquirer 11. The executor 15 evaluates an evaluation target (query) by inputting data to be input into each acquired model (main models and sub-models) (step S40).

The executor 15 supplies assessment information representing the result of the evaluation of the evaluation target to the transmitter 16. The transmitter 16 transmits the assessment information, received from the executor 15, to the user terminal 7 (step S41). Then, the request acquirer 11 returns to step S11 and is in a standby state until receiving the next request information.

A series of items of assessment processing is performed by that assessment device 1 as described above, and the assessment device 1 performs assessment processing comprising the steps S31 to S41 described above until stopping.

As described above, in accordance with the assessment device 1 according to the second embodiment, the list of solution information representing main models and supplemental data selected for evaluating an evaluation target can be provided to a user. The assessment device 1 can evaluate an evaluation target based on solution information selected according to manipulation by a user.

In the second embodiment, the explanation is given by taking, as an example, a case in which the plurality of main models are selected by the model acquirer 13. However, even when only one main model is selected, the executor 15 may create the solution information of the main model and may provide the solution information to the user terminal 7 via the transmitter 16.

In a stage in which the plurality of main models for evaluating an evaluation target by the model acquirer 13 are selected, the executor 15 may create the list of the solution information representing each main model before the supplemental data is selected. In this case, the supplemental data may be selected after the executor 15 has received the selected information (solution information). As the supplemental data selected in this case, supplemental data corresponding to the main models represented by the selected information may be selected.

The meta-information described in the first embodiment may be included in model-related information stored in a model memory 21 and data-related information stored in the data memory 22. In this case, the executor 15 may allow the list of the solution information to include meta-information corresponding to the selected main models and supplemental data. As a result, a user can select solution information in reference to the meta-information.

Third Embodiment

Figure 10:
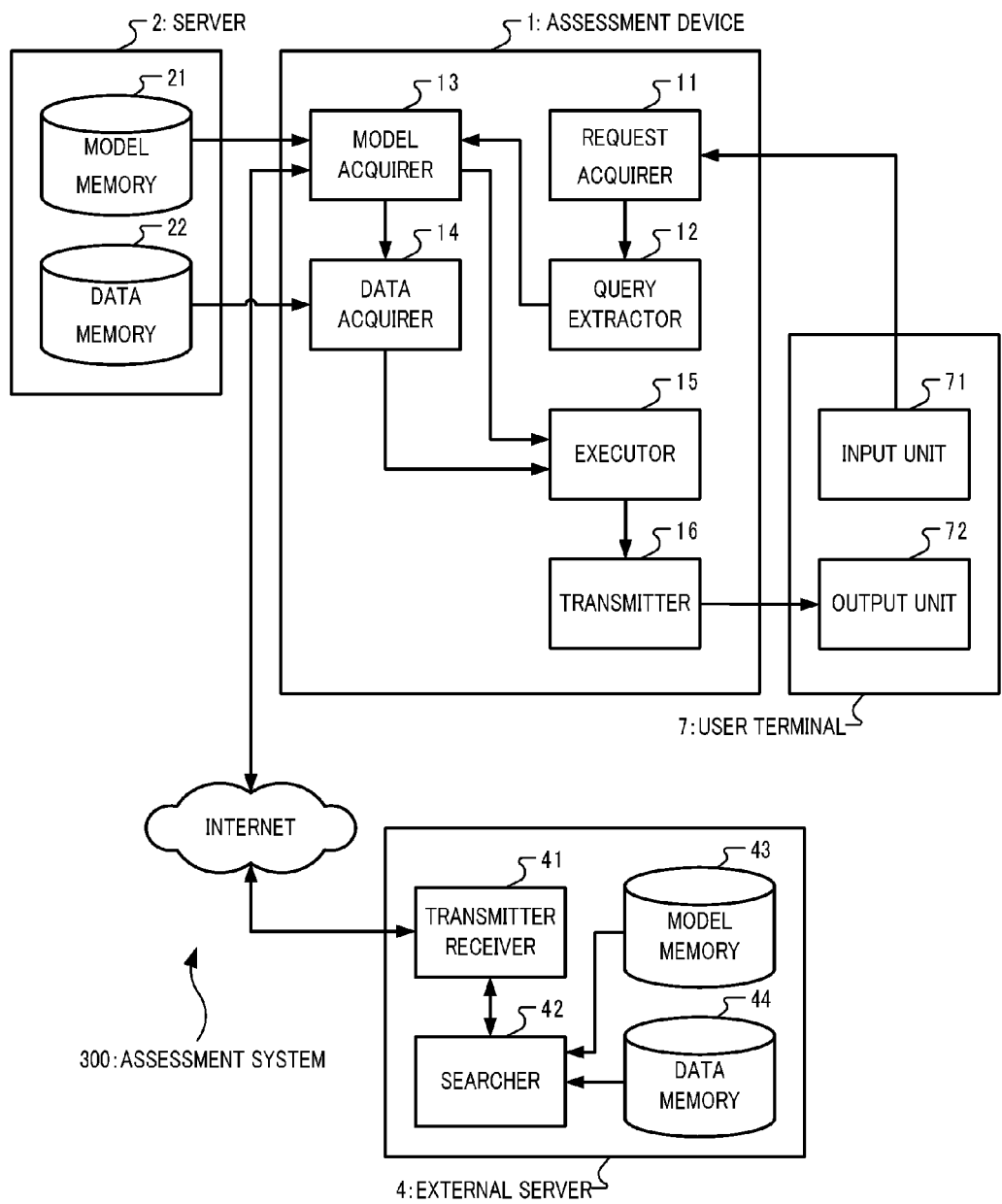
FIG. 10 is a block diagram illustrating the configuration of an assessment system according to a third embodiment of the present disclosure.

The configuration of an assessment device 1 according to a third embodiment of the present disclosure will be described below with reference to FIG. 10. The assessment device 1 comprises a configuration similar to the configuration described in the first embodiment. The assessment device 1 is communicatively connected to a server 2 and a user terminal 7 via networks as well as connected to an external server 4 via the Internet. The assessment device 1 transmits request information including a query to the external server 4 and receives a main model and supplemental data from the external server 4. The assessment device 1 and the external server 4 form an assessment system 300.

The external server 4 communicates with the assessment device 1 via the Internet. The external server 4 receives request information including a query from the assessment device 1. The external server 4 performs processing of selecting a main model for evaluating an evaluation target based on the query included in the received request information, and supplemental data to be supplemented for using the main model. The external server 4 transmits the selected main model and supplemental data to the assessment device 1.

The external server 4 comprises a transmitter-receiver 41, a searcher 42, a model memory 43, and a data memory 44.

The model memory 43 stores model-related information in a manner similar to that of a model memory 21 in the server 2. The data memory 44 stores data-related information in a manner similar to that of a data memory 22 in the server 2.

The transmitter-receiver 41 receives request information from the assessment device 1. For example, the transmitter-receiver 41 supplies request information to the searcher 42 when receiving the request information from the assessment device 1.

The searcher 42 receives request information from the transmitter-receiver 41. The searcher 42 selects a main model for evaluating an evaluation target based on the received request information with reference to model-related information stored in the model memory 43.

In addition, the searcher 42 selects supplemental data to be supplemented for using a main model with reference to the model-related information stored in the model memory 43 and data-related information stored in the data memory 44. Specifically, when the insufficient data of the selected main model is stored in the data memory 44, the searcher 42 selects the deficient data as supplemental data. When the insufficient data of the main model is not stored, the searcher 42 selects a sub-model that outputs the insufficient data as supplemental data with reference to the model-related information stored in the model memory 43. Furthermore, when the insufficient data of the selected sub-model is stored in the data memory 44, the searcher 42 selects the insufficient data as supplemental data. When the insufficient data of the sub-model is not stored, the sub-model that outputs the insufficient data is selected as supplemental data with reference to the model-related information stored in the model memory 43. In such a manner, the searcher 42 repeatedly performs the processing of selecting supplemental data until the insufficient data of the main model or the sub-model becomes absent.

The searcher 42 supplies the selected main model and supplemental data to the transmitter-receiver 41. The transmitter-receiver 41 transmits the main model and supplemental data, supplied from the searcher 42, to the assessment device 1.

Meanwhile, a model acquirer 13 in the assessment device 1 creates request information including a query received from a query extractor 12 and transmits the request information to the external server 4. Then, the model acquirer 13 receives the main model and supplemental data transmitted from the external server 4. The model acquirer 13 supplies the received main model and supplemental data to an executor 15. The executor 15 evaluates an evaluation target (query) by inputting data to be input into each model (main model or sub-model) when receiving the main model and supplemental data received from the model acquirer 13. The executor 15 transmits assessment information representing the result of the evaluation of the evaluation target to the user terminal 7 via a transmitter 16.

As described above, in accordance with the assessment device 1 according to the third embodiment, a main model and supplemental data selected by the external server 4 can be received by transmitting request information including a query to the external server 4. As a result, the processing of selecting the main model and supplemental data by the assessment device 1 can be performed by the external server 4 as a substitute to reduce the load of processing performed by the assessment device 1.

The assessment device 1 may select the main model and supplemental data stored in the external server 4 without transmitting the request information to the external server 4. In other words, the model acquirer 13 and a data acquirer 14 in the assessment device 1 may select the main model and the supplemental data with reference to the model-related information and data-related information stored in the external server 4 in a manner similar to a case in which the main model and supplemental data stored in the server 2 in the first embodiment are selected.

The external server 4 may evaluate an evaluation target (query) based on the request information received from the assessment device 1 and may transmit assessment information representing the result of the evaluation to the assessment device 1. In this case, the searcher 42 selects a main model and supplemental data based on the request information received from the assessment device 1 in a manner similar to those of the model acquirer 13 and the data acquirer 14 described in the first embodiment described above. The searcher 42 evaluates an evaluation target (query) by inputting data to be input into each model (main model or sub-model) based on the selected main model and supplemental data. Then, the searcher 42 transmits assessment information representing the result of the evaluation of the evaluation target to the assessment device 1. Meanwhile, the assessment device 1 transmits the assessment information, received from the external server 4, to the user terminal 7. As a result, the assessment device 1 can omit the processing of evaluating an evaluation target to further reduce the load of processing performed by the assessment device 1.

Each of the model-related information stored in the model memory 43 and the data-related information stored in the data memory 44 may also have access limitation information representing the acceptance or rejection of access to a model or data on eachem of user identification information. In this case, the assessment device 1 receives user identification information together with request information from the user terminal 7 and transmits the request information including the user identification information to the external server 4. The searcher 42 in the external server 4 retrieves a model or data to be selected based on a query included in the request information received from the assessment device 1. At this time, the searcher 42 determines the acceptance or rejection of access to the model or the data with reference to access limitation information corresponding to the user identification information received from the assessment device 1. The searcher 42 selects the model or data to be selected based on the result of the determination.

Each of the model-related information stored in the model memory 43 and the data-related information stored in the data memory 44 may also have access limitation information representing the acceptance or rejection of access to a model or data on each device identification information for identifying the assessment device 1. In this case, the assessment device 1 transmits request information including device identification information to the external server 4. The searcher 42 in the external server 4 searches a model or data to be selected based on a query included in the request information received from the assessment device 1. At this time, the searcher 42 determines the acceptance or rejection of access to the model or the data with reference to access limitation information corresponding to the device identification information received from the assessment device 1. The searcher 42 selects the model or data to be selected based on the result of the determination.

When the searcher 42 determines the impossibility of the access to the model or data based on the user identification information or the device identification information, the searcher 42 may transmit error information indicating the impossibility to the assessment device 1. The conditions of the acceptance or rejection of the access to the model or the data can be set by an arbitrary combination of the user identification information and the device identification information. For example, the access to the model or the data may be granted when any one of the user identification information and the device identification information is authenticated, or the access can be granted only when both are authenticated.

Fourth Embodiment

Figure 11:
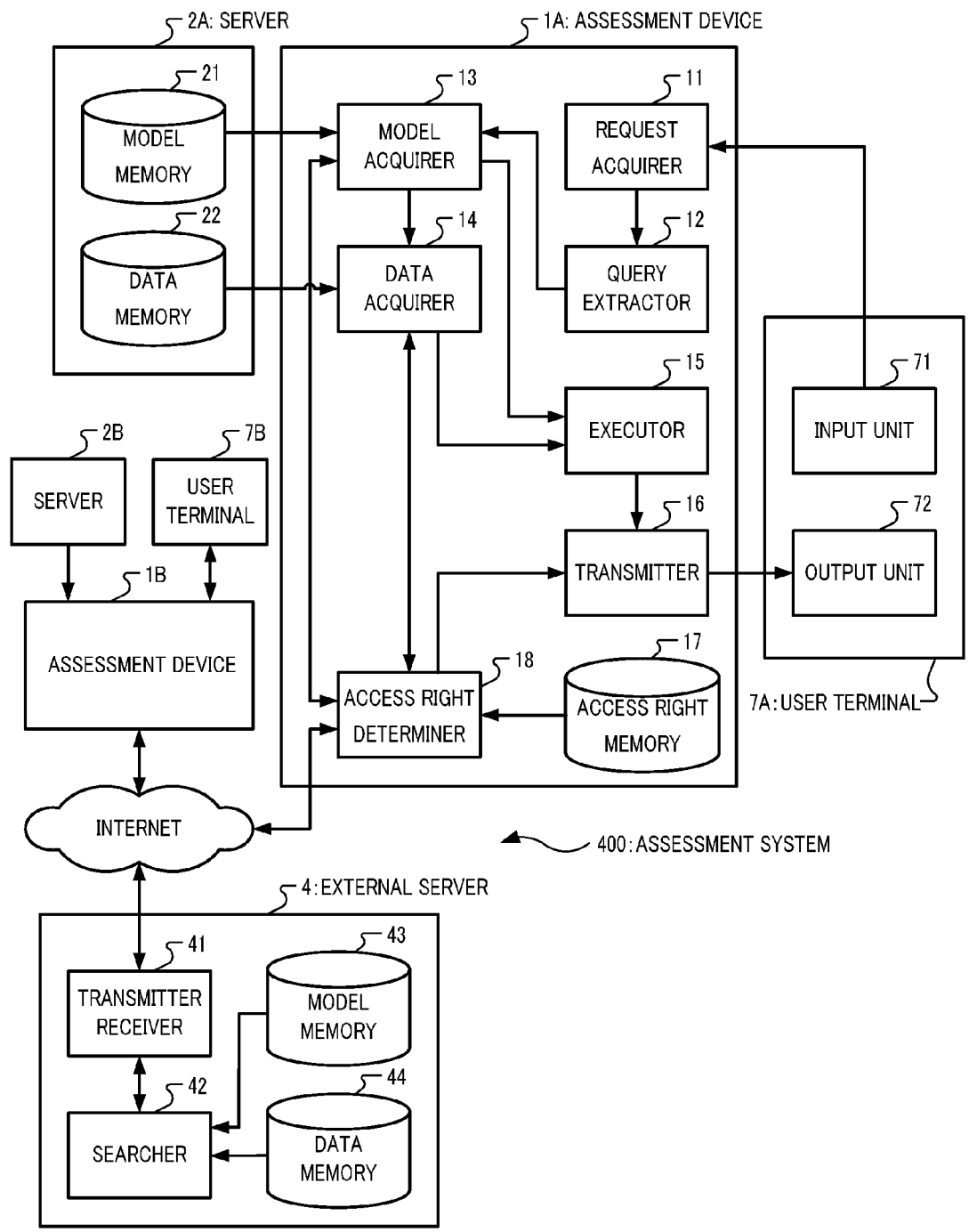
FIG. 11 is a block diagram illustrating the configuration of an assessment system according to a fourth embodiment of the present disclosure.

The configuration of an assessment device 1A according to a fourth embodiment of the present disclosure will be described below with reference to FIG. 11. The assessment device 1A is connected communicatively to a server 2A and a user terminal 7A via networks as well as connected communicatively to an external server 4 and an assessment device 1B via the Internet.

The assessment device 1B is connected communicatively to a server 2B and a user terminal 7B as well as connected communicatively to the external server 4 and the assessment device 1A via the Internet, in a manner similar to that of the assessment device 1A.

The assessment device 1A and the assessment device 1B form an assessment system 400. Hereinafter, the assessment devices 1A and 1B are referred to as assessment devices 1 unless being distinguished from each other. In addition, the servers 2A and 2B are referred to as servers 2 unless being distinguished from each other. In addition, the user terminals 7A and 7B are referred to as user terminals 7 unless being distinguished from each other. In the following description, a case in which the assessment system 400 comprises the two assessment devices 1 is described. However, the assessment system 400 may also comprise three or more assessment devices 1. This similarly applies to the servers 2 and the user terminals 7. The servers 2 and the user terminals 7 comprise configurations similar to the configurations described in the first to third embodiments.

In addition, the external server 4 comprises a configuration similar to the configuration described in the third embodiment. A model memory 43 stores access limitation information representing the acceptance or rejection of access to each model on each assessment device 1. A data memory 44 stores access limitation information representing the acceptance or rejection of access to each data on each assessment device 1.

The assessment device 1A comprises, in addition to the configuration described in the first embodiment, an access right memory 17 and an access right determinator 18. The assessment device 1B comprises a configuration similar to that of the assessment device 1A.

The access right memory 17 stores model-related information and data-related information stored in the model memory 43 and the data memory 44 in the external server 4, respectively. In addition, the access right memory 17 stores access limitation information representing the acceptance or rejection of access to each model or data stored in the external server 4 on each assessment device 1.

The access right determinator 18 selects main models and supplemental data stored in the external server 4 with reference to the model-related information and the data-related information stored in the access right memory 17 based on a query extracted by a query extractor 12. The access right determinator 18 classifies the selected main models and supplemental data into the main models and supplemental data that are able and unable to be accessed with reference to the access limitation information stored in the access right memory 17.

Specifically, for example, it is assumed that the model-related information represented in FIG. 3 and the data-related information represented in FIG. 4 are stored in the access right memory 17, and the access right determinator 18 selects a main model of which the model ID is "A1" and sub-models of which the model IDs are "A2" to "A5". In addition, it is assumed that the access right determinator 18 selects data of which the data ID is "D3". It is assumed that the access right determinator 18 classifies the models of which the model IDs are "A1" and "A5" into models that are able to be accessed by the access right determinator. It is assumed that the access right determinator 18 classifies the models of which the model IDs are "A2" to "A4" and the data of which the data ID is "D3" into models that are unable to be accessed by the access right determinator.

The access right determinator 18 creates first request information for requesting the data classified into data that is able to be accessed (hereinafter referred to as "first target data"), and transmits the first request information to the external server 4. In the example mentioned above, the access right determinator 18 transmits the first request information for requesting the first target data to the external server 4 with the models of which the model IDs are "A1" and "A5" as the first target data.

A searcher 42 in the external server 4 receives the first request information, transmitted from the assessment device 1A, via a transmitter-receiver 41. The searcher 42 determines whether or not a model or data represented by the received first request information can be accessed by the assessment device 1A. Whether or not to be able to be accessed by the assessment device 1A is determined by referring to the access limitation information stored in the model memory 43 or the data memory 44. The searcher 42 acquires the first target data based on the result of the determination. The searcher 42 transmits the acquired first target data to the assessment device 1A via the transmitter-receiver 41. In the example mentioned above, the searcher 42 acquires the models, of which the model IDs are "A1" and "A5", as the first target data, and transmits the first target data to the assessment device 1A.

The access right determinator 18 specifies an assessment device 1 that can access the data classified into data that is unable to be accessed (hereinafter referred to as "second target data"). The access right determinator 18 specifies the assessment device 1 with reference to the access limitation information stored in the access right memory 17. The access right determinator 18 creates second request information for requesting the second target data and transmits the second request information to the specified assessment device 1. In this case, it is assumed that the second request information is transmitted to the assessment device 1B. In the example mentioned above, the access right determinator 18 transmits the second request information for requesting the second target data to the assessment device 1B with the models of which the model IDs are "A2" to "A4" and the data of which the data ID is "D3" as the second target data.

The access right determinator 18 of the assessment device 1B transmits the second request information to the external server 4 when receiving the second request information from the assessment device 1A.

The searcher 42 in the external server 4 receives the second request information, transmitted from the assessment device 1B, via the transmitter-receiver 41. The searcher 42 determines whether or not a model or data represented by the received second request information can be accessed by the assessment device 1B. The searcher 42 acquires the second target data based on the result of the determination. The searcher 42 transmits the acquired second target data to the assessment device 1B via the transmitter-receiver 41. In the example mentioned above, the searcher 42 acquires the models of which the model IDs are "A2" to "A4" and the data of which the data ID is "D3" as the second target data and transmits the second target data to the assessment device 1B.

The access right determinator 18 of the assessment device 1B transmits the second target data to the assessment device 1A when receiving the second target data from the external server 4.

The access right determinator 18 of the assessment device 1A receives the first target data from the external server 4 and receives the second target data from the assessment device 1B. The received first target data and second target data configure the selected main models and supplemental data. In other words, in the example mentioned above, the main model of which the model ID is "A1" and the sub-models of which the model IDs are "A2" to A5" are received.

The access right determinator 18 evaluates an evaluation target (query) by inputting data to be input into each received model (main model or sub-model). The access right determinator 18 supplies assessment information representing the result of the evaluation of the evaluation target to a transmitter 16. The transmitter 16 transmits the assessment information to the user terminal 7.

As described above, in accordance with the assessment device 1 according to the fourth embodiment, target data comprising at least part of the selected main models and supplemental data can be requested from another assessment device 1. The assessment device 1 can evaluate an evaluation target based on the requested target data and the data other than the target data acquired by the assessment device and can reduce the load of processing performed by the assessment device 1.

In the embodiment described above, the target data requested from the assessment device 1B (second target data) and the data other than the target data acquired by the assessment device (first target data) are classified on the basis of data that are able and unable to be accessed by the assessment device. However, the data may be classified on a basis other than the basis.

The access right determinator 18 in the assessment device 1A may transmit request information for requesting the evaluation of target data rather than transmits request information for requesting the target data to the assessment device 1B. In this case, the access right determinator 18 transmits first request information for requesting the evaluation of the first target data mentioned above to the external server 4 as well as transmits second request information for requesting the evaluation of the second target data mentioned above to the assessment device 1B. It is assumed that the models of which the model IDs are "A1" and "A5" are acquired as the first target data in a manner similar to that of the example mentioned above. In addition, it is assumed that the models of which the model IDs are "A2" to "A4" and the data of which the data ID is "D3" are acquired as the second target data. In this case, the first request information for requesting the evaluation of the first target data is transmitted to the external server 4, and the second request information for requesting the second target data is transmitted to the assessment device 1B. The first and second request information includes a query extracted by the query extractor 12. For example, the query represents the region name "Z City" and the index "traffic noise" in a manner similar to that of the example mentioned above.

The searcher 42 in the external server 4 receives the first request information, transmitted from the assessment device 1A, via the transmitter-receiver 41. The searcher 42 acquires the first target data based on the received first request information and performs processing of evaluating the acquired first target data. In the example mentioned above, the searcher 42 acquires the models, of which the model IDs are "A1" and "A5", as the first target data. Subsequently, the searcher 42 evaluates objects that can be evaluated with the acquired first target data. Specifically, for example, "Z City" which is the region name included in the query can be input into the model of which the model ID is "A5, and "sound propagation characteristic of Z City" can be acquired. In contrast, data representing "traffic stream map of Z City" is insufficient to use the model of which the model ID is "A1". The searcher 42 transmits assessment information representing the result of the evaluation to the assessment device 1A. When it is impossible to evaluate the acquired second target data, the assessment information, which is allowed to include the target data that is unable to be evaluated, is transmitted. In the example mentioned above, the data representing "sound propagation characteristic of Z City" corresponds to the evaluation result, and the model of which the model ID is "A1" corresponds to the target data.

Meanwhile, the access right determinator 18 of the assessment device 1B transmits the second request information to the external server 4 when receiving the second request information from the assessment device 1A.

The searcher 42 in the external server 4 receives the second request information, transmitted from the assessment device 1B, via the transmitter-receiver 41. The searcher 42 acquires the second target data represented by the received second request information and carries out processing of evaluating the acquired second target data. In the example mentioned above, the searcher 42 acquires the models of which the model IDs are "A2" to "A4" and the data of which the data ID is "D3" as the second target data. Subsequently, the searcher 42 evaluates the acquired second target data. Specifically, for example, the data of which the data ID is "D3" can be input into the model of which the model ID is "A3", and data representing "traffic network of Z City" can be acquired. In addition, "Z City" which is the region name included in the query can be input into the model of which the model ID is "A4", and data representing "traffic trip statistics of Z City" can be acquired. Furthermore, data representing "traffic network of Z City" and data representing "traffic trip statistics of Z City" can be input into the model of which the model ID is "A2", and data representing "traffic stream map of Z City" can be acquired. The searcher 42 transmits assessment information representing the result of the evaluation to the assessment device 1B. In the example mentioned above, the data representing "traffic stream map of Z City" corresponds to the evaluation result.

The access right determinator 18 of the assessment device 1B transmits the assessment information to the assessment device 1A when receiving the assessment information from the external server 4.

The access right determinator 18 receives assessment information representing an evaluation result according to the first target data from the external server 4 of the assessment device 1A and receives assessment information representing an evaluation result according to the second target data from the assessment device 1B. The access right determinator 18 evaluates an evaluation target based on the evaluation result represented by each received assessment information. In other words, in the example mentioned above, the access right determinator 18 receives the main model of which the model ID is "A1", the data representing "traffic stream map of Z City", and the data representing "sound propagation characteristic of Z City". In this case, the access right determinator 18 acquires data representing "traffic noise map of Z City" by inputting the data representing "traffic stream map of Z City" and the data representing "sound propagation characteristic of Z City" into the main model of which the model ID is "A1". The access right determinator 18 supplies assessment information representing the result of the evaluation of the evaluation target to the transmitter 16. The transmitter 16 transmits the assessment information to the user terminal 7.

In such a manner, the access right determinator 18 of the assessment device 1A may transmit request information for requesting the evaluation of target data to the assessment device 1B and may receive assessment information representing the result of the evaluation from the assessment device 1B. As a result, the assessment device 1A can omit part of processing of evaluating an evaluation target to further reduce the load of processing performed by the assessment device 1A.

The access right determinator 18 of the assessment device 1B evaluate the target data (second target data) based on information stored in the server 2. For example, in the case of the example mentioned above, when data representing "traffic network of Z City" output from the model of which the model ID is "A2" is stored in the server 2, the data representing "traffic network of Z City" may be acquired as an evaluation result according to the target data. In this case, the access right determinator 18 transmits assessment information representing the evaluation result to the assessment device 1A. As a result, the load of processing performed by the external server 4 can be reduced.

If the access right determinator 18 is able to refer to model-related information, data-related information, and access limitation information representing the acceptance or rejection of access to each model or data, stored in the external server 4, the assessment device 1 need not comprise the access right memory 17. In this case, the access right determinator 18 selects a main model and supplemental data with reference to the model-related information and data-related information stored in the external server 4. In addition, the access right determinator 18 specifies the assessment device 1 that can access the above-described second target data classified into data that is unable to be accessed by the access right determinator with reference to the access limitation information stored in the external server 4.

The first to fourth embodiments are described above, and the configurations according to the respective embodiments can be appropriately combined.

For example, when the model acquirer 13 determines that data representing the result of the evaluation of a query (evaluation target) received from the query extractor 12 is stored in the server 2, the data can be regarded as an evaluation result. However, even in this case, the model acquirer 13 and the data acquirer 14 may perform processing of selecting a main model and supplemental data in order to evaluate an evaluation target based on the latest model and data. The main model and supplemental data selected as described above may also be provided as a list excluding the solution information described above.

Even when, in the data acquirer 14, the insufficient input data of a main model is stored in the data memory 22, the model acquirer 13 may select a sub-model or the input data of the sub-model in order to evaluate an evaluation target based on the latest model and data. The sub-model and data selected as described above may also be provided as a list excluding the solution information described above.

In each embodiment as described above, the case of application to the system for evaluating a target accepted from the outside is described. However, application to a system for analyzing a target and application to a system for simulating a target may be possible.

Figure 12:
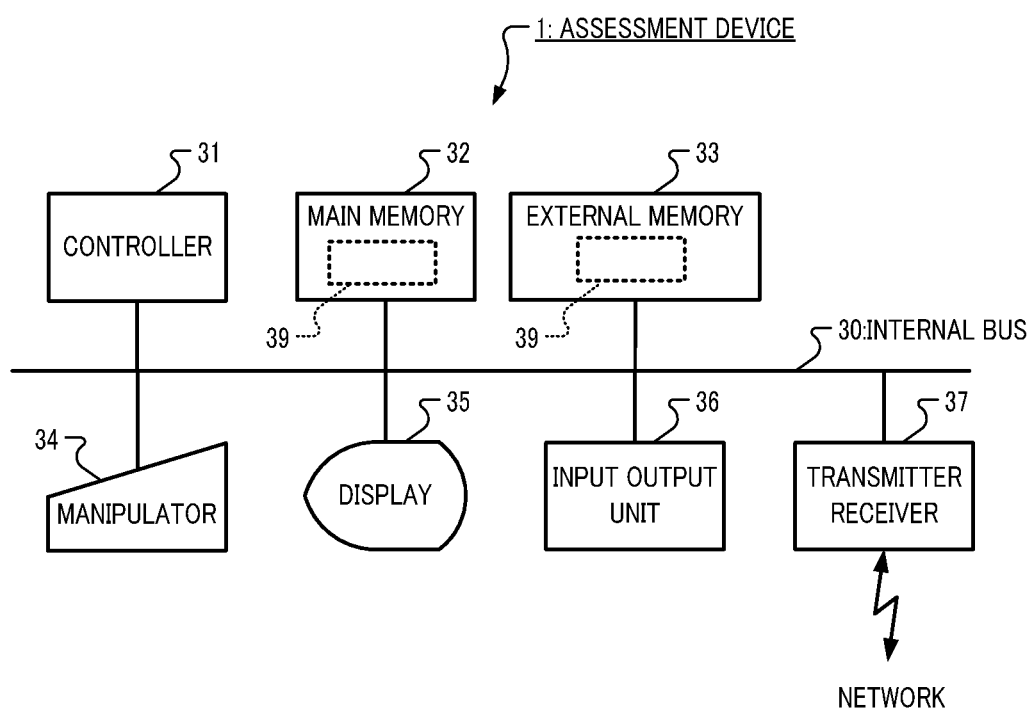
FIG. 12 is a block diagram illustrating the hardware configuration of an assessment device according to the present disclosure.

A hardware configuration included in the assessment device 1 will be described with reference to FIG. 12. The assessment device 1 comprises a controller 31, a main memory 32, an external memory 33, a manipulator 34, a display 35, an input/output device 36, and a transmitter-receiver 37. All of the main memory 32, the external memory 33, the manipulator 34, the display 35, the input/output device 36, and the transmitter-receiver 37 are connected to the controller 31 via an internal bus 30.

The controller 31 comprises a CPU (Central Processing Unit). The controller 31 executes a control program 39 loaded from the external memory 33 into the main memory 32. The query extractor 12, the model acquirer 13, the data acquirer 14, the executor 15, and the access right determinator 18 described in the first to fourth embodiments described above are realized by executing the control program 39 by the controller 31.

The main memory 32 comprises RAM (Random-Access Memory). The main memory 32 is used as a work area for the controller 31. The control program 39 stored in the external memory 33 is loaded into the main memory 32.

The external memory 33 comprises nonvolatile memory such as flash memory, a hard disk, DVD-RAM (Digital Versatile Disc Random-Access Memory), or DVD-RW (Digital Versatile Disc ReWritable). The control program 39 is pre-stored in the external memory 33. The access right memory 17 is realized by the external memory 33.

The manipulator 34 comprises: a keyboard, a pointing device such as a mouse, and the like; and a manipulation interface device that connects the keyboard, the pointing device, and the like to the internal bus 30.

The display 35 comprises a displaying device such as a CRT (Cathode Ray Tube) or an LCD (Liquid Crystal Display). When a user directly inputs information into the assessment device 1, a manipulation screen is displayed.

The input/output device 36 comprises an external peripheral device interface. The input/output device 36 is connected to the user terminal 7 and the server 2. The transmitter-receiver 37 comprises a communication interface device connected to a network. The request acquirer 11, the model acquirer 13, the data acquirer 14, the transmitter 16, and the access right determinator 18 are realized by the input/output device 36 or the transmitter-receiver 37.

In such a manner, information processing by the control program 39 performed by the assessment device 1, described in the first to fourth embodiments described above, is realized using hardware resources.

In addition, the hardware configurations and flowcharts mentioned above are examples and can be appropriately changed and modified.

The controller 31, the main memory 32, the external memory 33, the manipulator 34, the display 35, the input/output device 36, the transmitter-receiver 37, and the internal bus 30 can be realized using an ordinary computer system without depending on a dedicated system. For example, the assessment device 1 that executes the processing may be configured by distributing a computer-readable non-transitory recording medium (flexible disk, CD-ROM, DVD-ROM, or the like), in which a computer program for executing the operation is stored, and by installing the computer program on a computer. The assessment device 1 may also be configured by allowing the computer program to be stored in the storage device included in a server on a communication network such as the Internet and by performing the download or the like of the computer program to an ordinary computer system.

In the case of realizing the function of the assessment device 1 by the share of an OS (operating system) and an application program or by the cooperation of the OS and the application program, and/or the like, only the application program portion may also be stored in a non-transitory recording medium or a storage device.

A computer program, piggybacked onto a carrier wave, can also be delivered via a communication network. For example, the computer program may be listed in a bulletin board (BBS, Bulletin Board System) on the communication network and delivered via the network. In addition, a configuration may also be achieved such that the processing can be executed by starting the computer program and by executing the computer program under the control of an OS in a manner similar to those of the other application programs.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

Some or all of the embodiments described above can also be described as in the following supplemental notes but are not limited to the following.

(Supplemental Note 1)

An assessment device comprising:

acceptor that accepts an evaluation target from outside;

main model selector that selects a main model for evaluating the evaluation target accepted by the acceptor from a plurality of models;

supplemental data selector that selects supplemental data to be supplemented for using the main model when data to be input into the main model selected by the main model selector is insufficient;

evaluator that evaluates the evaluation target based on the main model selected by the main model selector and on the supplemental data selected by the supplemental data selector; and provider that provides a result, evaluated by the evaluator, to outside.

(Supplemental Note 2)

The assessment device according to Supplemental Note 1, wherein the supplemental data selector performs processing of selecting, as the supplemental data, each of insufficient data in a case in which the insufficient data of the main model is stored in a memory, a sub-model that outputs insufficient data in a case in which the insufficient data of the main model is not stored in the memory, insufficient data in a case in which the insufficient data of the sub-model is stored in the memory, and a sub-model that outputs insufficient data in a case in which the insufficient data of the sub-model is not stored in the memory.

(Supplemental Note 3)

The assessment device according to Supplemental Note 2, wherein the supplemental data selector repeatedly carries out the processing of selection as the supplemental data until the insufficient data of the main model or the sub-model becomes absent.

(Supplemental Note 4)

The assessment device according to any of Supplemental Notes 1 to 3, further comprising:

determinator for determining the presence or absence of data representing a result of evaluation of the evaluation target, wherein the supplemental data selector selects supplemental data to be supplemented for using the main model when the determinator determines that the data is absent; and the provider provides the data as a result of evaluation of the evaluation target to outside when the determinator determines that the data is present.

(Supplemental Note 5)

The assessment device according to any of Supplemental Notes 1 to 4, wherein the provider provides a list of solution information representing at least any of the main model selected by the main model selector and the supplemental data selected by the supplemental data selector to outside;

the acceptor accepts, from outside, selected information which is solution information selected from the list; and the evaluator evaluates the evaluation target based on the selected information accepted by the acceptor.

(Supplemental Note 6)

An assessment system comprising: an assessment device that accepts an evaluation target from outside; and a server connected to the assessment device via a network, wherein the server comprises:

request information receiver that receives request information, representing the evaluation target, from the assessment device;

main model selector that selects a main model for evaluating the evaluation target represented by the request information received by the request information receiver;

supplemental data selector that selects supplemental data to be supplemented for using the main model when data to be input the main model selected by the main model selector is insufficient; and transmitter that transmits the main model selected by the main model selector and the supplemental data selected by the supplemental data selector to the assessment device; and the assessment device comprises:

acceptor that accepts the evaluation target from outside;

transmitter that transmits request information, representing the evaluation target accepted by the acceptor, to the server;

receiver that receives the main model and the supplemental data from the server;

evaluator that evaluates the evaluation target based on the main model and the supplemental data received by the receiver; and provider that provides results, evaluated by the evaluator, to outside.

(Supplemental Note 7)

An assessment system comprising: an assessment device that accepts an evaluation target from outside; and a server connected to the assessment device via a network, wherein the server comprises:

request information receiver that receives request information, representing the evaluation target, from the assessment device;

main model selector that selects a main model for evaluating the evaluation target represented by the request information received by the request information receiver;

supplemental data selector that selects supplemental data to be supplemented for using the main model when data to be input into the main model selected by the main model selector is insufficient;

evaluator that evaluates the evaluation target based on the main model selected by the main model selector and on the supplemental data selected by the supplemental data selector; and transmitter that transmits results, evaluated by the evaluator, to the assessment device; and the assessment device comprises:

acceptor that accepts the evaluation target from outside;

transmitter that transmits request information, representing the evaluation target accepted by the acceptor, to the server;

receiver that receives a result, in which the evaluation target is evaluated, from the server; and provider that provides the result, received by the receiver, to outside.

(Supplemental Note 8)

An assessment system comprising: a first assessment device that accepts an evaluation target from outside; and a second assessment device that communicates with the first assessment device, wherein the first assessment device comprises:

acceptor that accepts the evaluation target from outside;

main model selector that selects a main model for evaluating the evaluation target accepted by the acceptor;

supplemental data selector that selects supplemental data to be supplemented for using the main model when data to be input into the main model selected by the main model selector is insufficient;

requester that requests target data comprising at least part of the main model selected by the main model selector and the supplemental data selected by the supplemental data selector from the second assessment device;

receiver that receives the target data requested from the second assessment device;

evaluator that evaluates the evaluation target based on the target data received by the receiver and on data other than the target data; and provider that provides a result, evaluated by the evaluator, to outside; and the second assessment device comprises:

request acceptor that accepts a request of the target data from the first assessment device;

acquirer that acquires the target data according to the request accepted by the request acceptor; and transmitter that transmits the target data, acquired by the acquirer, to the first assessment device.

(Supplemental Note 9)

An assessment system comprising: a first assessment device that accepts an evaluation target from outside; and a second assessment device that communicates with the first assessment device, wherein the first assessment device comprises:

acceptor that accepts the evaluation target from outside;

main model selector that selects a main model for evaluating the evaluation target accepted by the acceptor;

supplemental data selector that selects supplemental data to be supplemented for using the main model when data to be input into the main model selected by the main model selector is insufficient;

requester that requests an evaluation according to target data, comprising at least part of the main model selected by the main model selector and the supplemental data selected by the supplemental data selector, from the second assessment device;

receiver that receives an evaluation result according to the target data from the second assessment device;

evaluator that evaluates the evaluation target based on the evaluation result according to the target data, received by the receiver, and on data other than the target data; and provider that provides a result, evaluated by the evaluator, to outside; and the second assessment device comprises:

request acceptor that accepts a request of the evaluation according to the target data from the first assessment device;

target data acquirer that acquires the target data according to the request accepted by the request acceptor;

target data evaluator that evaluates the target data acquired by the target data acquirer; and transmitter that transmits an evaluation result according to the target data, obtained from the target data evaluator, to the first assessment device.

(Supplemental Note 10)

An assessment method comprising:

an acceptance step of accepting an evaluation target from outside;

a main model selection step of selecting a main model for evaluating the evaluation target accepted in the acceptance step from a plurality of models;

a supplemental data selection step of selecting supplemental data to be supplemented for using the main model when data to be input into the main model selected in the main model selection step is insufficient;

an evaluation step of evaluating the evaluation target based on the main model selected in the main model selection step and on the supplemental data selected in the supplemental data selection step; and a provision step of providing a result, evaluated in the evaluation step, to outside.

(Supplemental Note 11)

A computer-readable non-transitory recording medium, wherein there is recorded a program that allows a computer to function as:

acceptor that accepts an evaluation target from outside;

main model selector that selects a main model for evaluating the evaluation target accepted by the acceptor from a plurality of models;

supplemental data selector that selects supplemental data to be supplemented for using the main model when data to be input into the main model selected by the main model selector is insufficient;

evaluator that evaluates the evaluation target based on the main model selected by the main model selector and on the supplemental data selected by the supplemental data selector; and provider that provides a result, evaluated by the evaluator, to outside.

The present disclosure is based on Japanese Patent Application No. 2012-244386 filed on Nov. 6, 2012. The specification, claims, and drawings of Japanese Patent Application No. 2012-244386 are incorporated herein by reference in their entirety.

The invention claimed is:

1. An assessment device comprising:
a memory that stores a set of instructions; and
a hardware processor configured to execute the set of instructions to:
receive a request to evaluate an evaluation target;
determine, from a plurality of data models and based on the request, a first data model and first data for evaluating the evaluation target;
determine whether the first data satisfies a predetermined relationship with the first model;
if the first data does not satisfy the predetermined relationship:
 acquire second data, and
 evaluate the evaluation target by providing the second data to the first data model;
and
 provide a response to the request, the response including a result of the evaluation;
wherein the first data model is associated with an input data requirement and an output data attribute, and determining whether the first data satisfies a predetermined relationship with the first model comprises determining whether the first data satisfies the input data requirement of the first data model.

2. The assessment device according to claim 1, wherein the hardware processor is further configured to execute the set of instructions to:

determine whether data representing a result of evaluation of the evaluation target is stored in a storage;

if data representing a result of evaluation of the evaluation target is not stored in a storage, evaluate the evaluation target using the first data model;

if data representing a result of evaluation of the evaluation target is stored in a storage, provide the data as the response.

3. The assessment device according to claim 1, wherein the hardware processor is further configured to execute the set of instructions to:

provide, for displaying, a list of solution information including information about the first data model and a second data model;

receive a selection of the second data model from a list; and evaluate the evaluation target based on the second data model.

4. The assessment device of claim 1, wherein the second data is an output data of a second data model; wherein an attribute of the second data satisfies the input data requirement of the first data model.

5. An assessment device, comprising:

an acceptor that accepts an evaluation target from outside;

a main model selector that selects a main model for evaluating the evaluation target accepted by the acceptor from a plurality of models;

a supplemental data selector that selects supplemental data to be supplemented for using the main model when data to be input into the main model selected by the main model selector is insufficient, and performs processing of selecting, as the supplemental data, each of insufficient data in a case in which the insufficient data of the main model is stored in a memory, a sub-model that outputs insufficient data in a case in which the insufficient data of the main model is not stored in the memory, insufficient data in a case in which the insufficient data of the sub-model is stored in the memory, and a sub-model that outputs insufficient data in a case in which the insufficient data of the sub-model is not stored in the memory;

an evaluator that evaluates the evaluation target based on the main model selected by the main model selector and on the supplemental data selected by the supplemental data selector; and a provider that provides a result, evaluated by the evaluator, to outside.

6. The assessment device according to claim 5, wherein the supplemental data selector repeatedly performs the processing of selecting as the supplemental data until the insufficient data of the main model or the sub-model becomes absent.

7. An assessment system comprising: an assessment device that accepts an evaluation target from outside; and a server connected to the assessment device via a network, wherein the server comprises:

a request information receiver that receives request information, representing the evaluation target, from the assessment device;

a main model selector that selects a main model for evaluating the evaluation target represented by the request information received by the request information receiver;

a supplemental data selector that selects supplemental data to be supplemented for using the main model when data to be input into the main model selected by the main model selector is insufficient; and a transmitter that transmits the main model selected by the main model selector and the supplemental data selected by the supplemental data selector to the assessment device; and the assessment device comprises:

an acceptor that accepts the evaluation target from outside;

a transmitter that transmits request information, representing the evaluation target accepted by the acceptor, to the server;

a receiver that receives the main model and the supplemental data from the server;

an evaluator that evaluates the evaluation target based on the main model and the supplemental data received by the receiver; and a provider that provides results, evaluated by the evaluator, to outside.

8. An assessment system comprising: an assessment device that accepts an evaluation target from outside; and a server connected to the assessment device via a network, wherein the server comprises:

a request information receiver that receives request information, representing the evaluation target, from the assessment device;

a main model selector that selects a main model for evaluating the evaluation target represented by the request information received by the request information receiver;

a supplemental data selector that selects supplemental data to be supplemented for using the main model when data to be input into the main model selected by the main model selector is insufficient;

an evaluator that evaluates the evaluation target based on the main model selected by the main model selector and on the supplemental data selected by the supplemental data selector; and a transmitter that transmits results, evaluated by the evaluator, to the assessment device; and the assessment device comprises:

an acceptor that accepts the evaluation target from outside;

a transmitter that transmits request information, representing the evaluation target accepted by the acceptor, to the server;

a receiver that receives a result, in which the evaluation target is evaluated, from the server; and a provider that provides the result, received by the receiver, to outside.

9. An assessment system comprising:

a hardware interface coupled with a second device;

a memory that stores a set of instructions; and a hardware processor configured to execute the set of instructions to:

receive a request to evaluate an evaluation target;

determine a first data model and first data for evaluating the evaluation target;

determine whether the first data satisfies a predetermined relationship with the first model;

if the first data does not satisfy the predetermined relationship:

receive, via the hardware interface from the second device, target data comprising at least a part of the first model and second data, and evaluate the evaluation target based on the target data; and provide a response to the request, the response including a result of the evaluation;

wherein the first data model is associated with an input data requirement and an output data attribute, and determining whether the first data satisfies a predetermined relationship with the first model comprises determining whether the first data satisfies the input data requirement of the first data model.

10. The assessment system of claim 9, wherein the second data is an output data of a second data model; wherein an attribute of the second data satisfies the input data requirement of the first data model.

11. The assessment system of claim 9, wherein the memory stores a mapping relationship between an access right to the second data and the second device; wherein the hardware processor is configured to execute the set of instructions to acquire the second data from the second device based on the mapping relationship.

12. An assessment system comprising:
a hardware interface coupled with a second device;
a memory that stores a set of instructions; and
a hardware processor configured to execute the set of instructions to:
receive a first request to evaluate an evaluation target;
determine a first data model and first data for evaluating the evaluation target;
determine whether the first data satisfies a predetermined relationship with the first model;
if the first data does not satisfy the predetermined relationship:
receive, from the second device via the hardware interface, a first evaluation result associated with at least a part of the first data model and second data, and
evaluate the evaluation target based on the first evaluation result to generate a second evaluation result; and
provide a response to the request, the response including the second evaluation result;
wherein the first data model is associated with an input data requirement and an output data attribute, and determining whether the first data satisfies a predetermined relationship with the first model comprises determining whether the first data satisfies the input data requirement of the first data model.

13. The assessment system of claim 12, wherein the memory stores a mapping relationship between an access right to the second data and the second device; wherein the hardware processor is configured to execute the set of instructions to acquire the second data from the second device based on the mapping relationship.

14. The assessment system of claim 12, wherein the memory stores a mapping relationship between an access right to the second data and the second device; wherein the hardware processor is configured to execute the set of instructions to acquire the second data from the second device based on the mapping relationship.

15. An assessment method comprising:
receiving a request to evaluate an evaluation target;
determining, from a plurality of data models and based on the request, a first data model and first data for evaluating the evaluation target;
determining whether the first data satisfies a predetermined relationship with the first model;
if the first data does not satisfy the predetermined relationship:
acquiring second data, and
evaluating the evaluation target by providing the second data to the first data model;
and
providing a response to the request, the response including a result of the evaluation;
wherein the first data model is associated with an input data requirement and an output data attribute, and determining whether the first data satisfies a predetermined relationship with the first model comprises determining whether the first data satisfies the input data requirement of the first data model.

16. The assessment method of claim 15, wherein the second data is an output data of a second data model; wherein an attribute of the second data satisfies the input data requirement of the first data model.

17. A computer-readable non-transitory recording medium that stores a set of instructions that is executable by at least one processor of a computer to cause the computer to perform an assessment method, the method comprising:
receiving a request to evaluate an evaluation target;
determining, from a plurality of data models and based on the request, a first data model and first data for evaluating the evaluation target;
determining whether the first data satisfies a predetermined relationship with the first model;
if the first data does not satisfy the predetermined relationship:
acquiring second data, and
evaluating the evaluation target by providing the second data to the first data model;
and
providing a response to the request, the response including a result of the evaluation;
wherein the first data model is associated with an input data requirement and an output data attribute, and determining whether the first data satisfies a predetermined relationship with the first model comprises determining whether the first data satisfies the input data requirement of the first data model.

18. The medium of claim 17, wherein the second data is an output data of a second data model; wherein an attribute of the second data satisfies the input data requirement of the first data model.

* * * * *